United States Patent [19]

Sevier

[11] Patent Number: 5,574,251

[45] Date of Patent: Nov. 12, 1996

[54] ELECTRICAL AND ELECTRONIC CABINET SYSTEMS

[75] Inventor: Richard W. Sevier, Goleta, Calif.

[73] Assignee: Hendry Mechanical Works, Goleta, Calif.

[21] Appl. No.: 388,974

[22] Filed: Feb. 15, 1995

[51] Int. Cl.$^6$ .................................................. H05K 5/02
[52] U.S. Cl. .......................... 174/50; 174/60; 312/223.6
[58] Field of Search .................................... 174/50, 59, 60; 312/223.1, 223.6; 361/826, 827, 724

[56] References Cited

U.S. PATENT DOCUMENTS

| | | | |
|---|---|---|---|
| 2,756,369 | 7/1956 | Gorrie | 317/122 |
| 4,366,528 | 12/1982 | Cole | 361/429 |
| 4,496,057 | 1/1985 | Zenitani et al. | 211/26 |
| 4,536,052 | 8/1985 | Baker et al. | 339/126 R |
| 4,665,546 | 5/1987 | Brey et al. | 379/327 |
| 4,675,900 | 6/1987 | Temkin | 379/327 |
| 5,166,861 | 11/1992 | Krom | 361/379 |
| 5,326,934 | 7/1994 | LeMaster et al. | 174/59 |
| 5,396,405 | 3/1995 | Reed et al. | 361/827 |

Primary Examiner—Kristine L. Kincaid
Assistant Examiner—Dean A. Reichard
Attorney, Agent, or Firm—Benoit Law Corporation

[57] ABSTRACT

A cabinet has a top, an opposite bottom, a front, an opposite rear, and sides extending between that front and that rear for containment of electrical equipment requiring different groups of electric conductors. One of these sides is segmented between the front and the opposite rear into separate conductor channels for different groups of electric conductors, and that one side is provided with a removable cover structure for the conductor channels permitting access to these conductor channels from space adjacent that one side between the front and the opposite rear. Different ones of these groups of electric conductors may be arranged side by side in one of these sides between the front and the opposite rear. That one side may be provided with a cover structure between the front and the opposite rear for different ones of the groups of electric conductors by segmenting the cover structure in terms of such different ones of these groups of electric conductors into individually removable cover segments permitting selective access to any group of these electric conductors from space adjacent that one side by removal of a corresponding cover segment.

39 Claims, 4 Drawing Sheets

ELECTRICAL AND ELECTRONIC CABINET SYSTEMS

BACKGROUND OF THE INVENTION

The field of the subject invention covers electrical and electronic cabinet systems, including empty or wired cabinet structures and methods of preparing and of handling cabinets.

SUMMARY OF THE INVENTION

It is a general object of the invention to provide improved cabinet systems, particularly for electrical and electronic equipment.

It is a germane object of the invention to provide improved cabinet structures.

It is a related object of the invention to provide improved methods of preparing cabinets.

It is also an object of the invention to provide electrically wired or cabled cabinet structures.

It is also an object of the invention to provide cabinet systems wherein electrical conductors are grouped on sides of cabinet structures and are accessible from such sides, as distinguished from a front or a rear of the cabinet structures.

It is also an object of the invention to improve the attachment of cabinet covers to the remainder of the cabinet structure.

Other objects of the invention will become apparent in the further course of this disclosure.

The invention resides in a method of preparing a cabinet having a top, an opposite bottom, a front, an opposite rear, and a left-hand side and a right-hand side opposite said left-hand side extending between that front and that rear for containment of electrical equipment requiring different groups of electric conductors, and more specifically resides in the improvement comprising, in combination, segmenting one of these left-hand and right-hand sides between the front and the opposite rear into separate conductor channels for different groups of electric conductors, providing that one side with a removable cover structure for the conductor channels permitting access to these conductor channels from space adjacent that one side between the front and the opposite rear and structuring said removable cover structure as an outside wall of said cabinet on said one side.

The invention resides also in a method of preparing a cabinet having a top, an opposite bottom, a front, an opposite rear, a left-hand side, and a right-hand side opposite said left-hand side extending between that front and that rear for containment of electrical equipment requiring different groups of electric conductors, and more specifically resides in the improvement comprising, in combination, arranging different ones of these groups of electric conductors side by side in one of these left-hand and right-hand sides between the front and the opposite rear, and providing that one side with a cover structure between the front and the opposite rear for these different ones of these groups of electric conductors by segmenting the cover structure in terms of these different ones of these groups of electric conductors into individually removable cover segments permitting selective access to any group of these electric conductors from space adjacent that one side by removal of a corresponding cover segment and structuring said individually removable cover segments jointly as an outside wall of said one side.

The invention resides also in a cabinet having a top, an opposite bottom, a front, an opposite rear, and a left-hand side and a right-hand side opposite said left-hand side extending between that front and that rear, for electrical equipment requiring different groups of electric conductors, at least one of these left-hand and right-hand sides segmented into separate conductor channels between the front and the opposite rear for different groups of electric conductors, and a removable conductor channel cover structure on that side between the front and the opposite rear. The removable conductor channel cover structure constitutes an outside wall of the cabinet on the above mentioned one side.

The invention resides also in a cabinet having a top, an opposite bottom, a front, an opposite rear, and a left-hand side and a right-hand side opposite said left-hand side extending between that front and that rear for containment of electrical equipment requiring different groups of electric conductors, comprising in combination, different ones of these groups of electric conductors arranged side by side in one of these left-hand and right-hand sides between the front and the opposite rear, and a cover structure on that one side between the front and the opposite rear for the different ones of the groups of electric conductors, such cover structure segmented in terms of the different ones of the groups of electric conductors into individually removable cover segments. The individually removable cover segments constitute an outside wall of the cabinet.

According to an embodiment of the invention, further ones of the groups of electric conductors may be arranged side by side on an opposite side between the front and the opposite rear, and a further cover structure may be provided on the opposite side for such further ones of the groups of electric conductors. Such further cover structure may be segmented in terms of the further ones of the groups of electric conductors into individually removable further cover segments. Such further cover segments are jointly structured as an outside wall of the cabinet.

BRIEF DESCRIPTION OF THE DRAWINGS

The subject invention and its various aspects and objects will become more readily apparent from the following detailed description of preferred embodiments thereof, illustrated by way of example in the accompanying drawings, in which like reference numerals designate like or equivalent parts, and in which.

DESCRIPTION OF PREFERRED EMBODIMENTS

This and the accompanying drawings constitute a written description of the invention or inventions and of embodiments thereof.

Figure 1:
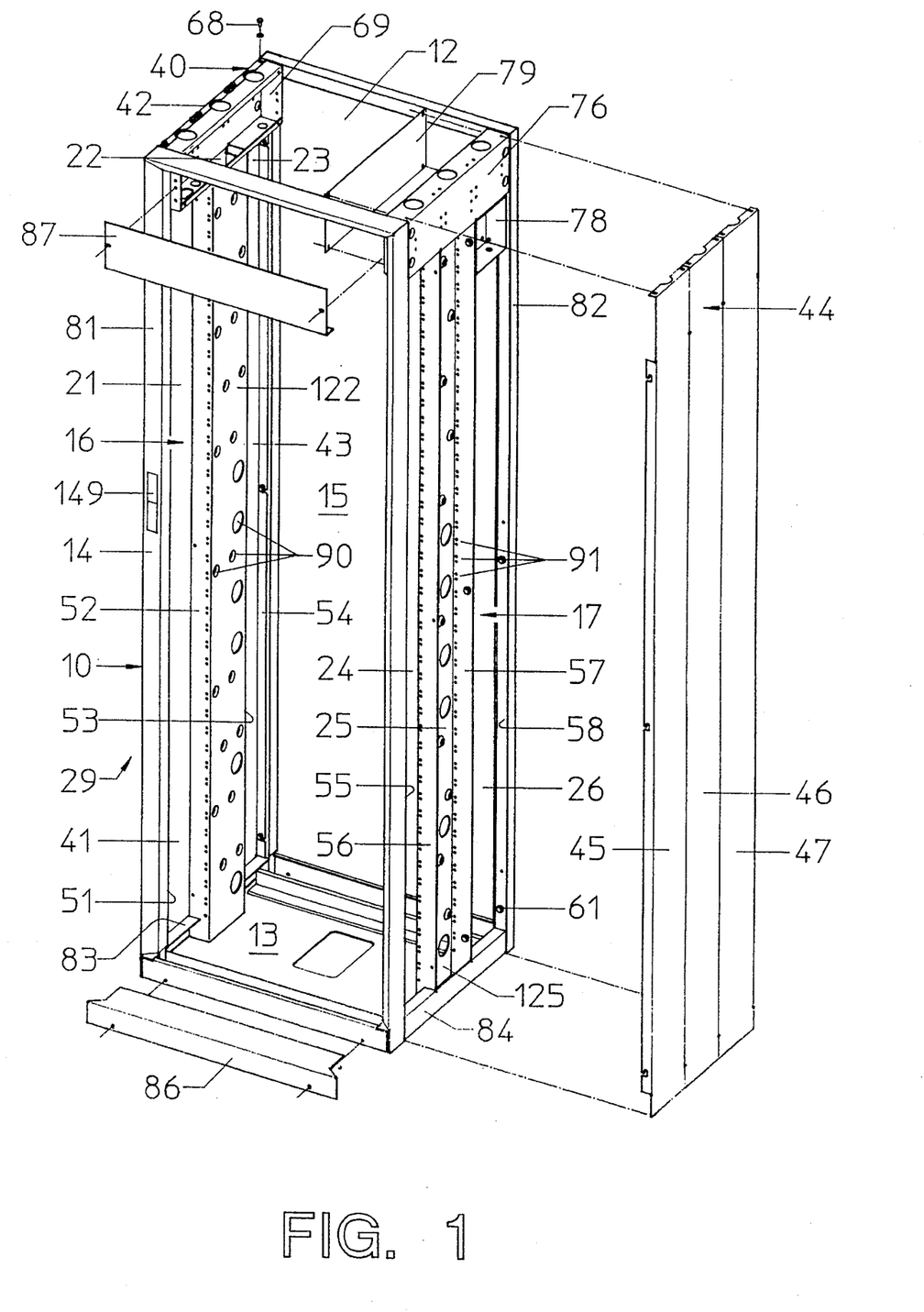
FIG. 1 is a perspective and partially exploded front view of a cabinet structure according to an embodiment of the invention.
Figure 2:
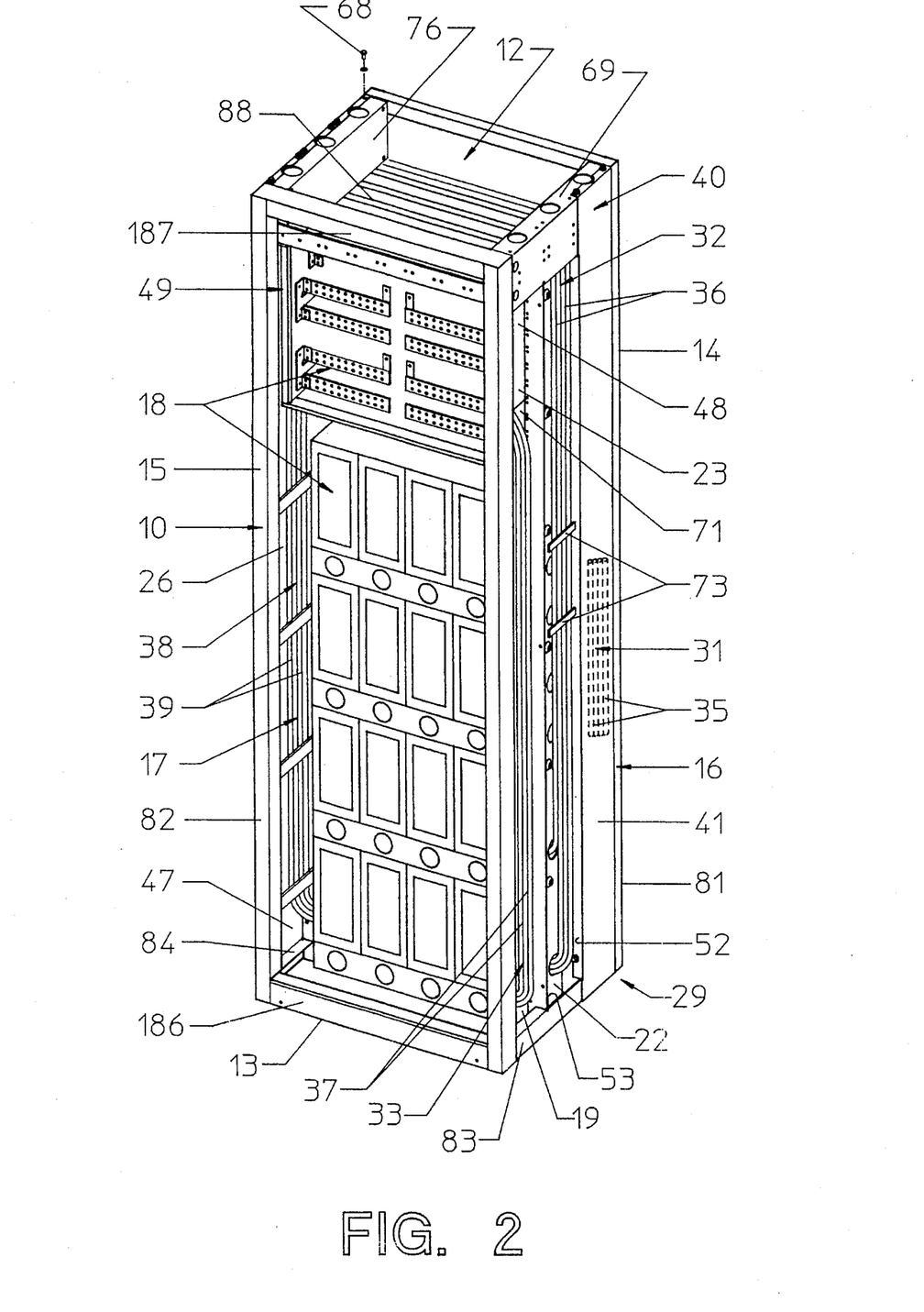
FIG. 2 is a perspective rear view of the cabinet structure shown in FIG. 1, wired according to an embodiment of the invention.

FIGS. 1 and 2 show a cabinet 10 and illustrate a method of preparing a cabinet having a top 12, an opposite bottom 13, a front 14, an opposite rear 15, and sides 16 and 17 extending between such front and rear for containment of electrical equipment 18 requiring different groups of electric conductors, such as three groups of electric conductors on each side in the illustrated example. As seen for instance in FIG. 1, if 14 is the front and 15 is the rear, then 16 is the left-hand side, while 17 is the right-hand side of the cabinet 10, looking at that cabinet from the front 14, as in FIG. 1.

In this respect, FIG. 1 shows an empty cabinet structure according to an embodiment of the invention, while FIG. 2 shows a rear view of the cabinet structure of FIG. 1, as equipped and wired according to a related embodiment of the invention.

As seen in FIGS. 1 and 2, one of the left-hand and right-hand sides 16 and 17 is segmented between the front 14 and the opposite rear 15 into three separate conductor channels 21, 22, 23 for three different groups 31, 32, 33 of electric conductors 35, 36, 37.

FIGS. 1 and 2 also show a removable conductor channel cover structure 40 permitting access to the conductor channels 21, 22, 23 from space 29 adjacent that side 16, rather than just from the rear 15 or from the front 14 as in prior-art cabinets, such as those disclosed in U.S. Pat. No. 5,166,861, by Thomas J. Krom, for Circuit Breaker Switchboard, issued Nov. 24, 1992 to Square D Company.

Within the scope of the invention, the side 16 may be provided with a cover for two or more of its conductor channels 21, 22, 23. However, according to a preferred embodiment of the invention, the removable conductor channel cover structure is segmented into individually removable individual covers 41, 42, 43 for the separate conductor channels 21, 22, 23 respectively, for selective access to any one of the conductor channels 21, 22, 23 and conductors from the side space 29 between the cabinet front 14 and its opposite rear 15. For a clearer understanding of these segmented covers 41, 42, 43, of the cover structure 40, reference may be had to the opposite cover structure 44 seen in FIG. 1 as composed of or compartmentalized into individually removable covers 45, 46, 47 that may be like or similar to the compartmentalized covers 41, 42, 43 of the cover structure 40 seen only partially in FIGS. 1 and 2.

In particular, like or similar cover panels 45, 46, 47 may be provided for the separate conductor channels 24, 25, 26 on the opposite side 17 of the cabinet, such as shown in FIG. 1.

In this respect and in general, the opposite side 17 may be segmented into separate conductor channels 24, 25, 26 for different further groups 38, etc. of electric conductors 39, etc., which may be provided with one or more removable covers 44 that preferably are segmented in terms of conductor channel covers or panels 45, 46, 47.

According to a related aspect of the invention, different groups of electric conductors 31, 32, 33 are arranged side by side in at least one of the sides between the front 14 and opposite rear 15, and that side has or is provided with a cover structure 40 for these different groups of electric conductors by segmenting the cover structure in terms of these different groups of electric conductors into individually removable cover segments 41, 42, 43 permitting selective access to a group of such electric conductors by removal of a corresponding cover segment 41, 42 or 43.

Further groups 38, etc., of electric conductors 39, etc., may be arranged side by side on an opposite side 17, and that opposite side has or is provided with a further cover structure 44 for these further groups of electric conductors by segmenting that further cover structure in terms of such further groups of electric conductors into individually removable further cover segments 45, 46, 47, permitting selective access to any group of further electric conductors by removal of a corresponding further cover segment 45, 46 or 47.

One group 31 of conductors 35 is shown in FIG. 2 in dotted lines below the cover panel 41 within the channel 21, while further groups 32 and 33 are shown solidly in that FIG. 2. One further group 38 of electric conductors 39 is seen in FIG. 2 in conductor channel 26, while the view of the other groups of electric conductors in channels 24 and 25 is obstructed by electrical equipment 18 served by or connected to the various conductors.

As seen in FIG. 2 where the conductors 39 are visible from inside the cabinet 10, one or more of the conductor channels, such as the channel 26, may be at least partially open at its bottom or may in effect extend to a side of electric equipment in the cabinet. This is shown by way of example in FIG. 2 for channel 23 that extends to the side 19 of electric equipment 18 and to a side 48 of a subcabinet 49 inside the cabinet 10.

However, one or more of the conductor channels, such as the channels 22 and 25, may be provided with an integral bottom or inner side wall 122 or 125.

Accordingly, pursuant to the illustrated embodiment, the side 16 or 17 is provided with an inner side wall 19, 48, 122 or 125 and the conductor channels 21, 22, 23 or 24, 25, 26 are laterally delimited by spaced bars 51, 52, 53, 54 or 55, 56, 57, 58 extending at least partially along such inner side wall or side walls.

According to a preferred embodiment of the invention, at least one of the conductor channels, such as the channel 22 or 25, is substantially enclosed on four sides by its inner side wall 122 or 125, by spaced bars 52, 53 or 56, 57 and by a part of the cover structure 40 or 44, such as by a cover segment 42 or 46. Central or other channels 22, 25, etc., may thus be provided from or with U-shaped profiles 52-122-53 or 56-125-57 selectively closed by a removable cover, door or panel 42 or 46. At least that part of the cabinet structure may be electrically conductive and preferably grounded.

The thus quadrilaterly enclosed channel 22 or 25 may, for instance, serve as a "high-frequency channel" for conductors subject or vulnerable to electromagnetic fields or radiation.

According to an embodiment of the invention, separate conductor channels 21, 22, 23, or 24, 25, 26 are provided with spaced bars or channel walls 51, 52, 53, 54 or 55, 56, 57, 58 and the removable cover 40, 41, 42, 43, 44, 45, 46 or 47 is removably attached to such spaced channel walls.

As seen from the drawings, the removable cover structure 40 or 44 constitutes or is structured as an outside wall of the cabinet 1 on the left-hand or right-hand side 16 or 17. In particular, the drawings show the segmented individual covers or cover segments 41, 42, 43 or 45, 46, 47 as jointly constituting or as being jointly structured as an outside wall of the cabinet 1 on the left-hand or right-hand side 16 or 17.

According to a preferred embodiment of the invention, the or any removable cover structure 40 to 47 is releasably retained at the side 16 or 17 with spaced cover retention pins 61 and corresponding locking cam arrangements 62 connected between such removable cover structure and other parts of the cabinet. By way of example, the delimiting bars or spaced channel walls 51, 52, 53, 54, 55, 56, 57 or 58 may be provided with spaced cover retention pins 61, and the removable cover or cover segments 41, 42, 43, 45, 46, 47 may be provided for each cover retention pin 61 with a locking cam arrangement 62.

Figure 3:
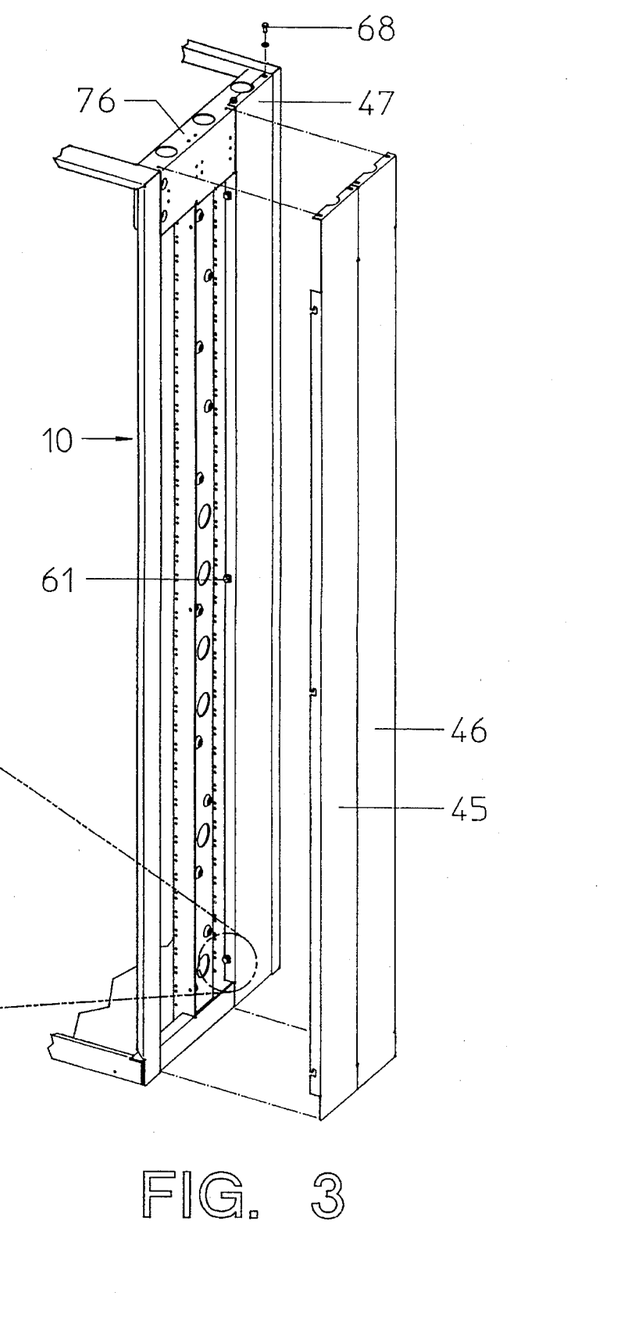
FIG. 3 is a detail view of a cover panel locking cam arrangement according to an embodiment of the invention that can be used in the cabinet structure of FIGS. 1 and 2.
Figures 3A, 3B:
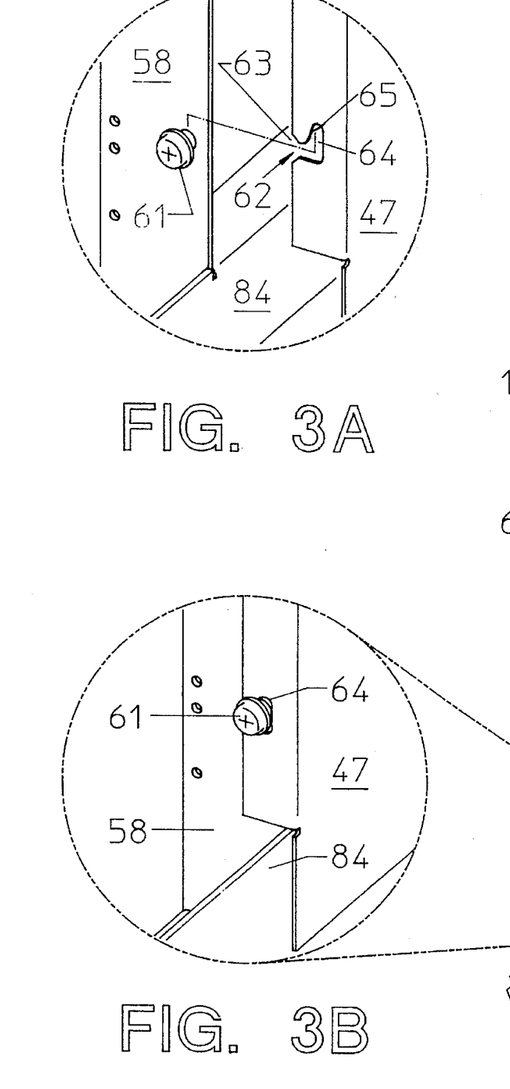
FIG. 3A is an enlarged view or part of FIG. 3 marked by a circle 3A–B, but showing a locking cam arrangement prior to locking.
FIG. 3B is enlarged view similar to FIG. 3A, but showing the arrangement upon locking as in FIG. 3.

As seen in FIG. 3A, each locking cam arrangement 62 may have or be provided with an open-ended first slot 63 in a removable cover segment 45, 46, 47, etc., for receiving a cover retention pin 61, and a second slot 64 extending in that removable cover segment at an angle to the first slot 63 and delimiting a locking surface 65 in that removable cover segment.

Within the broad scope of this aspect of the invention, such locking need do nothing more than prevent the cover or cover segments 40, 41, 42 . . . 47 etc., from falling off the side panel or cabinet, such as shown in FIG. 3B. If desired, the slot 64 or locking surface 65 may extend at a slightly acute angle to the vertical or to the main surface of the cover or cover segments 40, 41, 42, 43, 44, 45, 46, 47 so that such cover or cover segments are pulled tightly toward the channels 21, 22, 23, 24, etc., when such cover or cover segments are installed on the side panel or cabinet over the retention pins 61. That refinement may, for instance, be implemented when rattling of cover segments during operation of the equipment or due to vibration would be a problem.

In either case, each cover segment 41, 42, 43 . . . 47 etc., can be releasably secured by one or two screws 68 that may, for instance, be threaded into part of the cabinet frame or junction box 69 or 76.

As seen in FIG. 2, the cabinet 10 may be provided with a subhousing 49 for part of the electrical equipment 18, and passages for electric conductors may be provided between predetermined conductor channels 21, 22, 23, etc., and the subhousing. For example, a transverse channel 71 may be provided between the subhousing 49 and one of the separate conductor channels, such as the channel 23.

Within the scope of the invention, the conductor channels may extend horizontally, obliquely or in any other manner. However, according to a preferred embodiment of the invention, the conductor channels are arranged or extend substantially vertically between the top 12 and the bottom 13 of the cabinet, such as shown in FIGS. 1 and 2.

Various kinds and types of conductors may be accommodated in cabinet structures according to the invention. Insulated wires or cables 35, 36, 37, 39, etc., may be held together in groups or subgroups by straps 73.

The electric conductors in channels 21, 22, 23, 24, etc. may be insulated or bare. If bare, they need to be spaced with insulators from the cabinet structure, at least if they are not grounding wires or bars.

Figure 4:
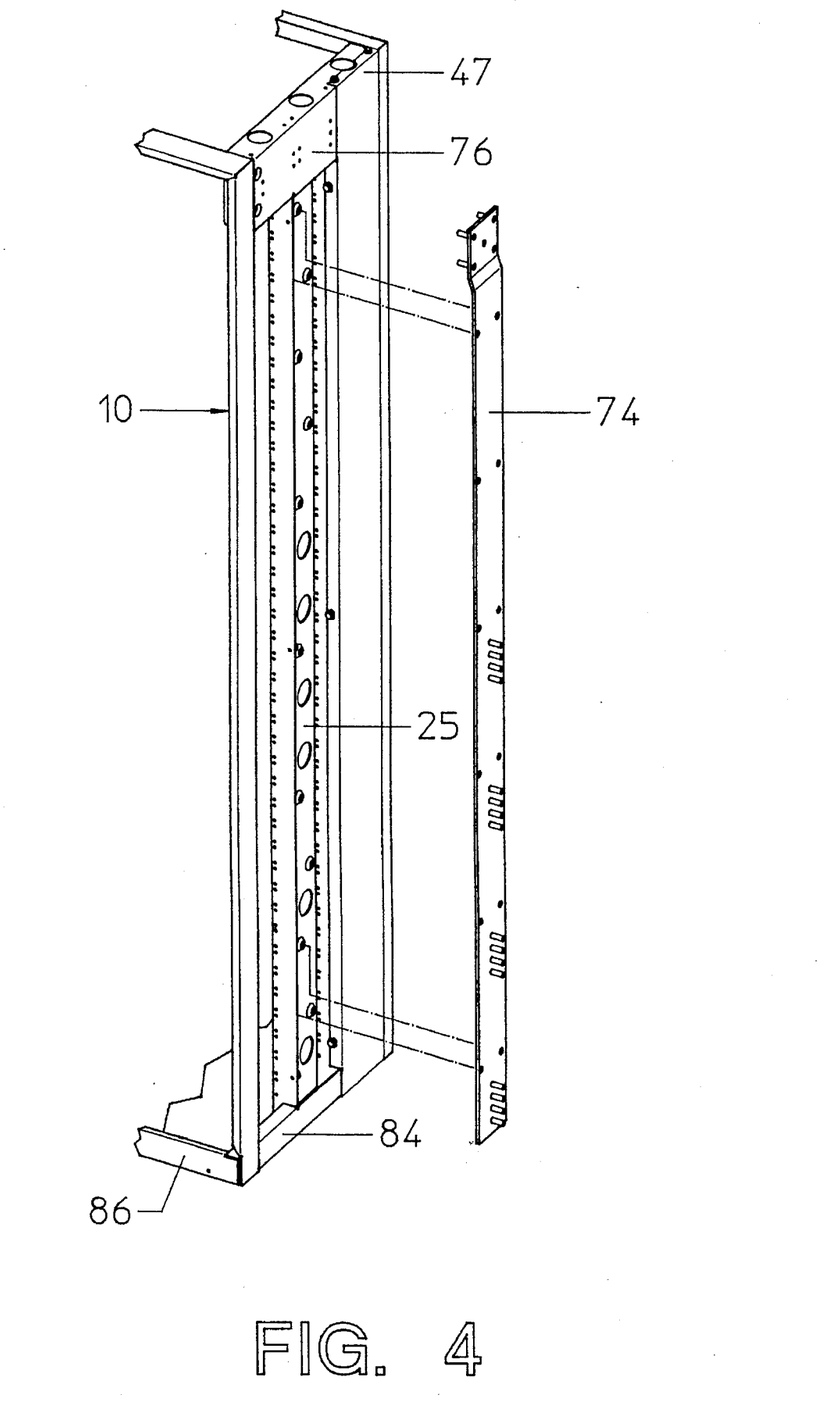
FIG. 4 is a partially exploded detail view of a channel structure with bus bar that can be used in the cabinet structure of FIGS. 1 and 2.

FIG. 4 shows a bus bar 74 in one of the conductor channels 25 as an electric conductor extending therein or therethrough. Since such bus bar typically serves as a connecting point for several leads or wires, it may be considered a group within the meaning of that term set forth above with respect to the conductor channels.

Junction boxes 69 and 76 may house electrical terminals for connecting the conductors in channels 22, 25, etc., to external equipment or systems, such as an electric power supply or electric power feed lines, or equipment or lines electrically fed or controlled by electrical equipment 18 contained in the cabinet 10. For instance, one of the boxes, such as box 69, may be an input junction box, while the other box 76 may serve as an output junction box.

By way of example, in the case of power rectifiers as or in the internal equipment 18, boxes 69 and 76 may contain terminals for the junction of feed lines and the like. For instance, the box 69 may be the alternating-current feed line box, while the box 76 may be the direct-current output power box. In that case, the side 16 may, for instance, be the "alternating-current side," while the opposite side 17 may then be the "direct-current side." The conductor groups 31, 32, 33, 38, etc., preferably are also segregated as between alternating current and direct current and also as between the different direct-current polarities.

One or more of the channels 21 to 26 may contain control wires and auxiliary conductors and such extras as an auxiliary junction box 78.

In brief, by compartmentalizing conductors into different groups according to input, output, nature, polarity, purpose or function, preferred embodiments of the invention effectively prevent cross-talk or crossover between different groups of conductors or electrical or electronic circuits or functions and safeguard attending personnel from confusion and against accidental injury, while protecting electrical or electronic components from damage or malfunction.

The boxes 69, 76, and 78 may be provided with removable covers, such as the cover 79 shown for the box 76 in FIG. 1.

The cabinet 10 includes front and back frame structures 81 and 82 and supports 83 and 84 for mounting some of the conductor channels, such as the central channels 22 and 25, and for defining other conductor channels, such as channels 21, 23, 24 and 26. The cabinet may be provided with the junction boxes 69 and 76 as upper mounting frame members, opposite the lower frame members 83 and 84. The cabinet frame may be supplemented by a bottom cover 86 or 186, and may be complemented by a top cover 87 or 187 between junction boxes or top frame members 69 and 76. Gaps and the like may be covered up by removable trim strips (not shown).

Cables or conductors may also extend or be hung between the lateral conductor channels 21, 22, 23, 24, 25, 26, such as shown at 88 in FIG. 2.

Cabinet structures according to preferred embodiments of the invention lend themselves to construction or fabrication in a seismically reinforced manner for high earthquake resistance, thereby effectively forestalling power failures or communication or service breakdown during such calamities.

The cabinet 10 may be closed at the top 12, at the front and in the rear by additional covers or panels and/or by one or more doors. Providing the cables or conductors accessible from either side or preferably from both sides of the cabinet has several advantages. For one thing, it enables the cabinet structure to be placed straight against the wall, without need of movement of the thusly placed cabinet structure away from the wall for access to the cabling. It also frees the front of the cabinet structure from the kind of cabling or conductor arrays found in prior-art structures. Accordingly, the front of the cabinet, such as at 14, is freed for the insertion, actuation, servicing, and removal or replacement of electrical apparatus, devices and equipment 18, and the rear, such as at 15, may be so freed as well, within the scope of the invention.

Within the scope of the invention, not all electrical equipment need to be contained inside of the cabinet structure. For instance, circuit breakers or circuit breaker actuators, electrical control actuators, electric signal lights and other equipment and devices all summarized hereby by the expression "electrical controls," may be provided at the outside of the cabinet structure. For instance, a symbolic representation 149 in FIG. 1 indicates such electrical controls as being mounted in or on the frame 81 at the front 14 of the cabinet structure. In practice, the frame 81 may be made wider for that purpose on that left-hand side than on its opposite right-hand side.

Preferred embodiments of the cabinet structure may be provided with mounting hole patterns for a support and attachment of various electrical apparatus, devices or equipment. By way of example, the illustrated cabinet structure and its channels or channel sides 22, 25, 52, 53, 56, 57, 122 and 125 include patterns of mounting holes and other apertures 90 and 91 which may conform to an industry standard for mounting or accommodating particular electrical or electronic devices, apparatus or equipment.

Moreover, this extensive disclosure will render apparent or suggest to those skilled in the art various modifications and variations within the spirit and scope of the invention.

I claim:

1. In a method of preparing a cabinet having a top, an opposite bottom, a front, an opposite rear, a left-hand side and a right-hand side opposite said left-hand side, each of said sides extending between said front and said rear for containment of electrical equipment requiring different groups of electric conductors, the improvement comprising in combination:

segmenting one of said left-hand and right-hand sides between said front and said opposite rear into separate conductor channels for different groups of electric conductors;

providing said one side with a removable cover structure for said conductor channels permitting access to said conductor channels from space adjacent said one side between said front and said opposite rear; and structuring said removable cover structure as an outside wall of said cabinet on said one side.

2. A method as in claim 1, including:

segmenting an opposite side between said front and said opposite rear into further separate conductor channels for different further groups of electric conductors;

providing said opposite side with a further removable cover for said further conductor channels permitting access to said further conductor channels from an opposite space adjacent said opposite side between said front and said opposite rear; and structuring said further removable cover structure as a further outside wall of said cabinet on said opposite side.

3. A method as in claim 1, wherein:

said conductor channels are arranged substantially vertically between said top and said bottom.

4. A method as in claim 1, wherein:

said removable cover structure is releasably retained at said one side with spaced cover retention pins and corresponding locking cam arrangements connected between said removable cover structure and other parts of said cabinet.

5. A method as in claim 4, wherein:

each locking cam arrangement has an open-ended first slot in said cover structure for receiving one of said cover retention pins, and a second slot extending at an angle to said first slot and delimiting a locking surface in said cover structure.

6. A method as in claim 1, wherein:

said removable cover structure is segmented into individually removable individual covers for said separate conductor channels, respectively, for selective access to any one of said conductor channels from said space adjacent said one side between said front and said opposite rear by removal of a corresponding one of said individually removable individual covers;

said individual covers being jointly structured as said outside wall of said cabinet on said one side.

7. A method as in claim 1, wherein:

said separate conductor channels are provided with spaced channel walls; and said removable cover structure is removably attached to said spaced channel walls.

8. A method as in claim 7, wherein:

said spaced channel walls are provided with spaced cover retention pins; and said removable cover structure is provided for each cover retention pin with a locking cam arrangement.

9. A method as in claim 8, wherein:

each said locking cam arrangement has an open-ended first slot in said cover structure for receiving one of said cover retention pins, and a second slot extending at an angle to said first slot and delimiting a locking surface in said cover structure.

10. A method as in claim 1, wherein:

said side is provided with an inner side wall; and said conductor channels are laterally delimited by spaced bars extending along said inner side wall.

11. A method as in claim 10, wherein:

at least one of said conductor channels is substantially enclosed on four sides by said inner side wall, by said spaced bars and by a part of said cover structure.

12. In a method of preparing a cabinet having a top, an opposite bottom, a front, an opposite rear, a left-hand side and a right-hand side opposite said left-hand side, one of said sides extending between said front and said rear for containment of electrical equipment requiring different groups of electric conductors, the improvement comprising in combination:

arranging different ones of said groups of electric conductors side by side in one of said left-hand and right-hand sides between said front and said opposite rear;

providing said one side with a cover structure between said front and said opposite rear for said different ones of said groups of electric conductors by segmenting said cover structure in terms of said different ones of said groups of electric conductors into individually removable cover segments permitting selective access to any group of said electric conductors from space adjacent said one side by removal of a corresponding cover segment; and structuring said individually removable cover segments jointly as an outside wall of said cabinet on said one side.

13. A method as in claim 12, including:

arranging further ones of said groups of electric conductors side by side on an opposite side between said front and said opposite rear;

providing said opposite side with a further cover structure between said front and said opposite rear for said further ones of said groups of electric conductors by segmenting said further cover structure in terms of said further ones of said groups of electric conductors into individually removable further cover segments permitting selective access to any group of said further ones of said electric conductors from an opposite space adjacent said opposite side by removal of a corresponding further cover segment; and structuring said individually removable further cover segments as a further outside wall of said cabinet on said opposite side.

14. A method as in claim 12, wherein:

said removable cover segments are individually retained at said one side with spaced cover retention pins and corresponding locking cam arrangements connected between said removable cover segments and other parts of said cabinet.

15. A method as in claim 14, wherein:

each locking cam arrangement has an open-ended first slot in one of said removable cover segments for receiving one of said cover retention pins, and a second slot extending in that removable cover segment at an angle to said first slot and delimiting a locking surface in that removable cover segment.

16. A method as in claim 12, wherein:

a bus bar is provided in one of said sides as an electric conductor of one of said groups.

17. A cabinet having a top, an opposite bottom, a front, an opposite rear, a left-hand side and a right-hand side opposite said left-hand side, each of said sides extending between said front and said rear, for electrical equipment requiring different groups of electric conductors, at least one of said left-hand and right-hand sides segmented into separate conductor channels between said front and said opposite rear for different groups of electric conductors, and a removable conductor channel cover structure on said side between said front and said opposite rear; and said removable conductor channel cover structure constituting an outside wall of said cabinet on said one side.

18. A cabinet as in claim 17, including:

an opposite one of said sides between said front and said opposite rear segmented into further separate conductor channels for different further groups of electric conductors, and a further removable cover structure for said further conductor channels; and said further removable cover structure constituting a further outside wall of said cabinet on said opposite side.

19. A cabinet as in claim 17, wherein:

said conductor channels extend substantially vertically between said top and said bottom.

20. A cabinet as in claim 17, including:

cover retention pins and corresponding locking cam arrangements between said removable conductor channel cover structure and other parts of said cabinet.

21. A cabinet as in claim 20, wherein:

each locking cam arrangement has an open-ended first slot in said cover structure for receiving one of said cover retention pins, and a second slot extending at an angle to said first slot and delimiting a locking surface in said cover structure.

22. A cabinet as in claim 17, wherein:

said removable cover structure comprises individually removable individual cover segments for said separate conductor channels, respectively; and said individual cover segments constitute said outside wall of said cabinet on said one side.

23. A cabinet as in claim 17, wherein:

said separate conductor channels have spaced channel walls, with said removable cover structure removably attached to said spaced channel walls.

24. A cabinet as in claim 23, including:

spaced cover retention pins on said spaced channel walls; and a corresponding locking cam arrangement on said removable cover structure for each cover retention pin.

25. A cabinet as in claim 24, wherein:

each locking cam arrangement has an open-ended first slot in said cover structure for receiving one of said cover retention pins, and a second slot extending at an angle to said first slot and delimiting a locking surface in said cover structure.

26. A cabinet as in claim 17, wherein:

said side has an inner side wall; and said conductor channels include spaced bars laterally delimiting said conductor channels and extending along said inner side wall.

27. A cabinet as in claim 26, wherein:

at least one of said conductor channels has four sides substantially enclosed by said inner side wall, by said spaced bars, and by a part of said cover structure.

28. A cabinet having a top, an opposite bottom, a front, an opposite rear, a left-hand side and a right-hand side opposite said left-hand side, each of said sides extending between said front and said rear for containment of electrical equipment requiring different groups of electric conductors, comprising in combination:

different ones of said groups of electric conductors arranged side by side in one of said left-hand and right-hand sides between said front and said opposite rear;

a cover structure on said one side between said front and said opposite rear for said different ones of said groups of electric conductors, said cover structure segmented in terms of said different ones of said groups of electric conductors into individually removable cover segments;

said individually removable cover segments constituting an outside wall of said cabinet on said one side.

29. A cabinet as in claim 27, including:

further ones of said groups of electric conductors arranged side by side on an opposite side between said front and said opposite rear;

a further cover structure on said opposite side for said further ones of said groups of electric conductors, said further cover structure segmented in terms of said further ones of said groups of electric conductors into individually removable further cover segments; and said further cover segments constituting a further outside wall of said cabinet on said opposite side.

30. A cabinet as in claim 28, including:

cover retention pins and corresponding locking cam arrangements between said removable conductor channel cover structure and other parts of said cabinet.

31. A cabinet as in claim 28, including:

spaced cover retention pins connected to the cabinet at said one side; and corresponding locking cam arrangements in said removable cover segments.

32. A cabinet as in claim 31, wherein:

each locking cam arrangement has an open-ended first slot in one of said removable cover segments for receiving one of said cover retention pins, and a second slot extending in that removable cover segment at an angle to said first slot and delimiting a locking surface in that removable cover segment.

33. A cabinet as in claim 28, including:

a bus bar in said side as an electric conductor of one of said groups.

34. A method as in claim 5, wherein:

each said locking surface is extended at an acute angle to a main surface of said cover structure so that said cover structure is pulled tightly toward said channels when said cover structure is installed over said cover retention pins.

35. A method as in claim 9, wherein:

each said locking surface is extended at an acute angle to a main surface of said cover structure so that said cover structure is pulled tightly toward said channels when said cover structure is installed over said cover retention pins.

36. A method as in claim 15, wherein:

each said locking surface is extended at an acute angle to a main surface of said one of said cover segments.

37. A cabinet as in claim 21, wherein:

each said locking surface extends at an acute angle to a main surface of said cover structure, whereby said cover structure is pulled tightly toward said channels when said cover structure is installed over said cover retention pins.

38. A cabinet as in claim 25, wherein:

each said locking surface extends at an acute angle to a main surface of said cover structure, whereby said cover structure is pulled tightly toward said channels when said cover structure is installed over said cover retention pins.

39. A cabinet as in claim 32, wherein:

each said locking surface extends at an acute angle to a main surface to a corresponding removable cover segment, whereby said cover segment is pulled tightly toward said channels when said cover segment is installed over said cover retention pins.

\* \* \* \* \*